United States Patent [19]
Sandhu et al.

[11] Patent Number: 5,893,758
[45] Date of Patent: Apr. 13, 1999

[54] ETCHING METHOD FOR REDUCING CUSPING AT OPENINGS

[75] Inventors: Gurtej S. Sandhu; Anand Srinivasan, both of Boise, Id.

[73] Assignee: Micron Technology, Inc., Boise, Id.

[21] Appl. No.: 08/671,163

[22] Filed: Jun. 26, 1996

[51] Int. Cl.$^6$ .................................................. H01L 21/302
[52] U.S. Cl. ..................... 438/708; 438/746; 438/696; 438/714
[58] Field of Search ..................... 438/618, 626, 438/627, 631, 669, 710, 714, 708, 746, 696; 204/192.34

[56] References Cited

U.S. PATENT DOCUMENTS

| | | | |
|---|---|---|---|
| 4,832,788 | 5/1989 | Nemiroff | 438/717 |
| 5,206,187 | 4/1993 | Doan et al. | 438/618 |
| 5,368,687 | 11/1994 | Sandhu et al. | 438/710 |
| 5,563,095 | 10/1996 | Frey | 438/707 |
| 5,607,601 | 3/1997 | Loper et al. | 216/63 |

*Primary Examiner*—Maria Nuzzolillo
*Assistant Examiner*—Laura Weiner
*Attorney, Agent, or Firm*—Workman, Nydegger & Seeley

[57] ABSTRACT

Disclosed is a method for selectively etching an opening in order to reduce cusping on and thereby widen the opening. The opening in one embodiment comprises a contact opening with a diffusion barrier liner layer deposited thereover that has formed cusps at the mouth of the contact opening. The contact opening is exposed to an etching agent at a low temperature and pressure such that the etching agent adheres to the contact opening. Photons are then directed towards the contact opening at an acute angle to the surface of the contact opening. The acute angle causes the surface of the contact opening to block the photons from contacting the bottom of the contact opening with a high flux density. The photons impart an energy to activate the etching agent, causing substantial etching of an upper portion of the contact opening, while a lower portion does not receive a significant flux density and is not substantially etched. Cusps are thereby removed from the mouth of the contact opening without substantially removing the material from the bottom of the contact opening. Further depositions can then be conducted without pinching off the mouth of the contact opening. A further embodiment is disclosed in which the foregoing method is used to planarize raised structural features with large openings without forming keyholes in the openings.

41 Claims, 3 Drawing Sheets

ETCHING METHOD FOR REDUCING CUSPING AT OPENINGS

BACKGROUND OF THE INVENTION

1. The Field of the Invention

The present invention relates to the manufacture of semiconductor devices. More particularly, the present invention is directed to methods of selectively etching a material from an opening in a structural layer of a semiconductor wafer with a preference for more rapidly etching the material from an upper portion of the opening than from a lower portion of the opening. The method of the present invention is particularly useful in removing cusps from the surface of a contact opening with a high aspect ratio in order that the contact opening can be filled with uniform step coverage.

2. The Relevant Technology

Recent advances in computer technology and in electronics in general have been brought about at least in part as a result of the progress that has been achieved by the integrated circuit industry in electronic circuit densification and miniaturization. This progress has resulted in increasingly compact and efficient semiconductor devices, attended by an increase in the complexity and number of semiconductor devices aggregated on a single integrated circuit wafer. The smaller and more complex semiconductor devices, including resistors, capacitors, diodes, and transistors, have been achieved, in part, by reducing semiconductor device sizes and spacing and by reducing the junction depth of active regions formed on a silicon substrate of an integrated circuit wafer. The smaller and more complex semiconductor devices have also been achieved by stacking the semiconductor devices at various levels on the wafer.

Among the semiconductor device features which are being reduced in size are the electrical communication interconnect structures through which electrical contact is made between discrete semiconductor devices, or portions of such devices, located on nonadjacent levels of the wafer. These electrical communication interconnect structures include contacts, vias, plugs, trenches, and other structures, whereby electrical connection is made to discrete semiconductor devices, or components of semiconductor devices, located at the varying levels of integrated circuit wafers. These and other such interconnect structures will hereafter be collectively referred to as "interconnect structures." Interconnect structure openings are defined herein as etched conduits between layers which, when filled with conductive material, form the interconnect structure. By way of example, a contact opening is an interconnect structure opening that is filled with a conductive material to form an interconnect structure called a contact. In order to continue in the process of reducing integrated circuit size, new interconnect structure formation methods which overcome certain problems existing in the art are required.

Many of the problems currently encountered when forming interconnect structures arise from the fact that the interconnect structure openings are becoming increasingly smaller. Interconnect structure openings are currently designed with diameters within the half micron range. Also, the aspect ratio of the interconnect structure openings, the ratio of the height of the openings in which interconnect structures are formed to the width of these openings, is becoming very high. Aspect ratios for contact openings are currently greater than about three. It is difficult to deposit with good step coverage the necessary conducting filler material in these tiny, narrow, high sided contact openings. These factors make it difficult to form increasingly miniaturized interconnect structures which retain a high conductivity.

Currently, interconnect structure openings are filled with conducting filler material using one of two processes, chemical vapor deposition (CVD) and physical vapor deposition (PVD), the latter of which is also known as sputtering. Each of these processes has limitations and associated problems. For instance, limitations of the materials that can be deposited with CVD make it impractical for many applications. A shortcoming of existing PVD processes involves the phenomena of cusping, which occurs as a result of nonuniform step coverage, when high aspect ratio interconnect structure openings are being filled. Cusping also occurs to a lesser degree in CVD processes.

The problem of cusping will be discussed herein in greater detail in conjunction with the contact structure of FIG. 1. A specific type of contact known as a tungsten plug is being formed therein. Typically, in the formation of a tungsten plug, an active region 12 on a silicon substrate 10 is being connected with surface metallization layers. A contact opening 14 is formed through a passivation layer 15, and a diffusion barrier liner layer 16 is deposited over contact opening 14. Diffusion barrier liner layer 16 is typically formed of titanium, which has a high tendency to form cusps 18 at a surface 13 of contact opening 14. Cusps 18 are formed by the deposition of large quantities of the conducting filler material concentrated at a the top of contact opening 14. Rather than being deposited in the bottom of contact opening 14, the slight angularity of the trajectory of sputtered material causes the fill material to aggregate at a mouth at the top of contact opening mouth 14, resulting in cusps 18.

Cusps 18 grow during continued deposition, progressively blocking the top or mouth of contact opening 14 until contact opening 14 is finally pinched off. Consequently, during the subsequent step of filling the remainder of contact opening 14 with a tungsten 18 layer 22, as shown in FIG. 2, tungsten layer 22 will close over cusps 14 and pinch off the top of contact opening 14, leaving a keyhole 19. The presence of a keyhole in a contact opening causes a high contact resistance, a reduction in semiconductor device speed, and a potential failure of the semiconductor device, particularly as the aspect ratio of the contact opening increases.

Attempts to remedy the angularity of the trajectory of sputtered material which causes cusping have included the use of collimators. Collimators are honeycombed structures used within PVD chambers to block the deposition of sputtered materials impinging at angles to the wafer. Nevertheless, collimators only reduce the degree of cusping, and cannot fully prevent it.

Thus, it becomes apparent that in order to continue in the progress of integrated circuit densification and miniaturization, an improved method is needed which reduces or eliminates cusping in the formation of interconnect structures. Such a method would be particularly beneficial if a contact could be formed thereby with a high aspect ratio and a high conductivity.

SUMMARY OF THE INVENTION

The present invention seeks to resolve the above and other problems that have been experienced in the art. In accordance with the invention as embodied and broadly described herein in the preferred embodiment, a method is provided for widening an opening, such as interconnect structure opening, formed in a structural layer of a semiconductor wafer. The method uses directional energy to selectively etch an upper portion of the opening down to a selected depth without substantially etching a lower portion.

Under the method of the present invention, the opening is first formed or otherwise provided through a surface on a structural layer of the semiconductor wafer, and is then exposed to an etching agent such as a halide that is activated by directional energy. The exposure to the etching agent is conducted at a low temperature and pressure so that the etching agent adheres to the opening but does not react with the opening in the absence of exposure to directional energy.

The opening is, in a further step, exposed to the directional energy. The preferred form of directional energy is photons of light. The photons are directed to the opening at an acute angle imparting energy to the etching agent as the photons contact the opening. The acute angle allows the surface of the structural layer in which the opening is formed to block the photons and prevent the photons from reaching the lower portion of the opening near the bottom of the opening with a significant flux density. A higher flux density of photons is imparted to an upper portion of the opening at or near the mouth of the opening. This disparity in flux density between the upper portion and the lower portion causes the etching agent to etch more at the upper portion than at the lower portion.

One application of the foregoing inventive method is the formation of an interconnect structure. Thus, for example, a high aspect ratio contact opening can be filled with conductive filler material to form a contact. When so doing, a first layer of conductive filler material such as a diffusion barrier liner layer is initially deposited in the contact opening. After disposition of the conductive filler material, the etching method of the present invention is conducted to reduce cusping of the diffusion barrier liner layer at the surface of the contact opening.

The acute angle of the photons during the step of selectively etching a material from the opening is selected such that the contact opening is etched with a specified degree of etching down to a selected depth so as to reduce or eliminate cusping and thus preventing pinch-off of the top of the contact opening. The acute angle also prevents the bottom of the contact opening from receiving a significant flux density of photons. As a result, the portion of the diffusion barrier liner layer that is located over the mouth of the contact opening is reduced in thickness by the step of selectively etching a material from the opening, but the portion of the diffusion barrier liner layer located at the bottom of the contact opening is not substantially etched. Thus, by properly selecting the acute angle, the depth of etching can be selected and used to tailor the aspect ratio of the opening as well as the uniformity of step coverage of material deposited in the opening.

The foregoing manipulative steps can be repeated after each of multiple depositions until the contact opening is suitably filled. Cusping and keyholing are consequently reduced or eliminated, and step coverage is caused to become more uniform. The result is that a high aspect ratio and miniaturized contact opening can be formed with a resulting high conductivity when filled with a conductive material.

A further embodiment of the method of the present invention involves planarization of structural features. Under this embodiment, raised structural features with an intervening opening can be planarized without reducing the height of the structural features. In so doing, a planarization layer of dielectric material is deposited over the surface of the intervening opening, and then the planarization layer is etched substantially as described above, both reducing cusping and etching excess dielectric material from upper levels of the planarization layer. Further planarization layers are then deposited, followed by etching in the above-described manner, in combination if necessary, with a height reduction process such as CMP (Chemical Mechanical Polishing) and/or etchback steps. The use of the etching method of the present invention eliminates keyhole formation during the filling of the opening.

BRIEF DESCRIPTION OF THE DRAWINGS

A more particular description of the invention briefly described above will be rendered by reference to specific embodiments thereof which is illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention comprises a method for widening an opening formed in the surface of a structural layer on a silicon wafer by conducting a selective etch with the use of directional energy that etches a material from the opening with a specified degree of etching occurring on a first portion near a mouth of the opening and a lesser degree of etching occurring on a second portion near the bottom of the opening. The method is highly suitable for use in forming high aspect ratio interconnect structures with uniform step coverage, and is also useful for planarizing raised structural features with large intervening openings without reducing the height of the raised structural features.

Figure 1:
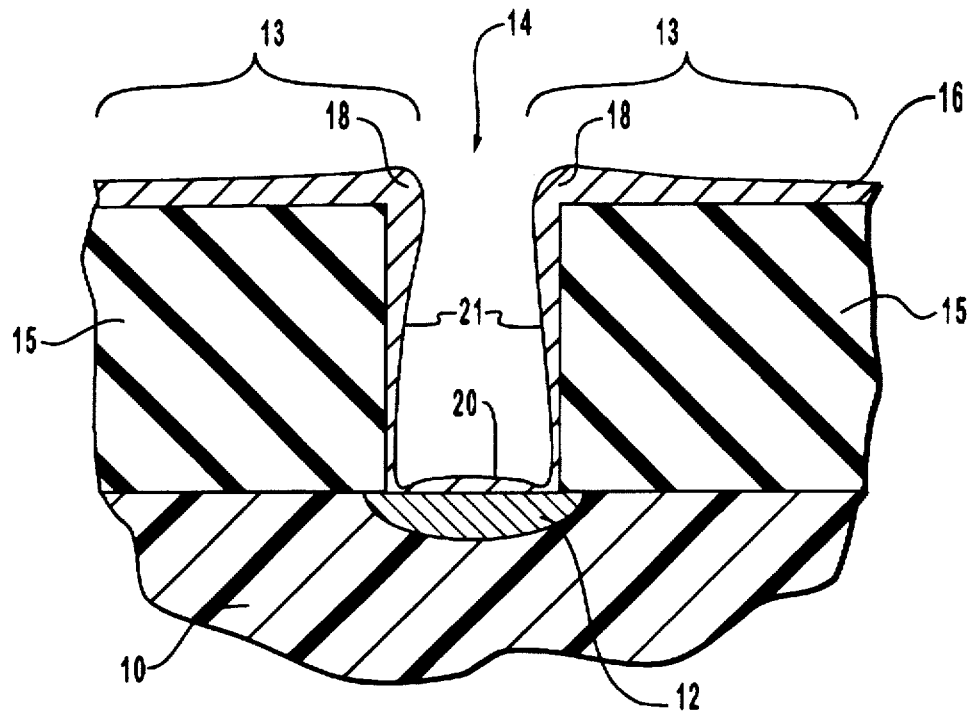
FIG. 1 shows the occurrence of cusping in a cross-sectional depiction of a step in the process of forming a contact under a conventional method in the art.
Figure 2:
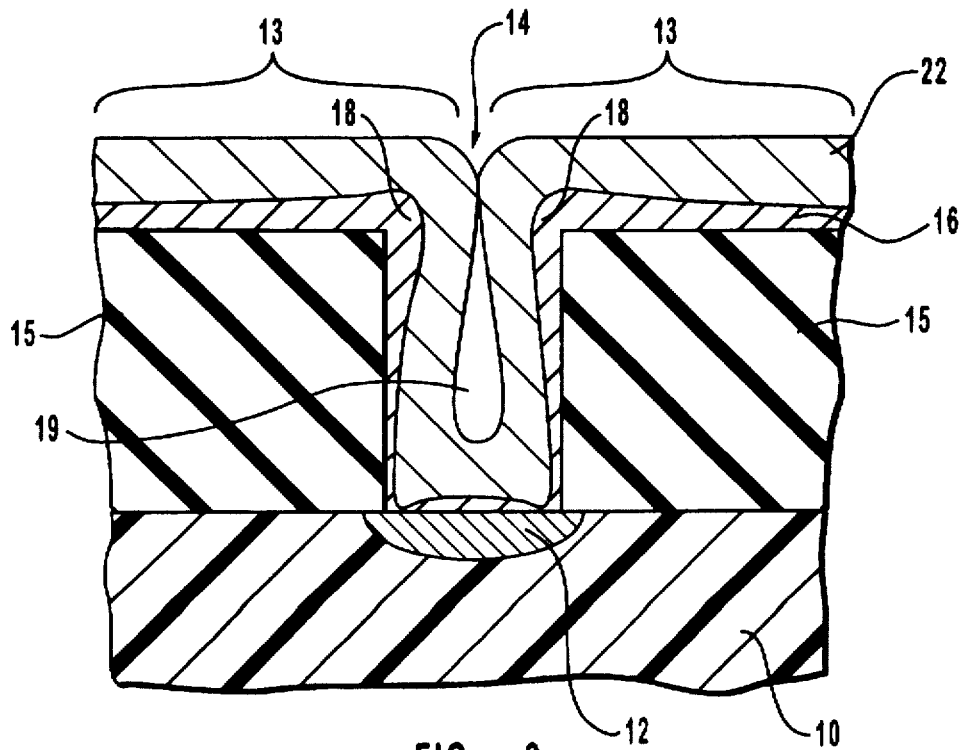
FIG. 2 shows the formation of a keyhole in a cross-sectional depiction of a step in the process of forming a contact opening subsequent to the step of FIG. 1.
Figure 3:
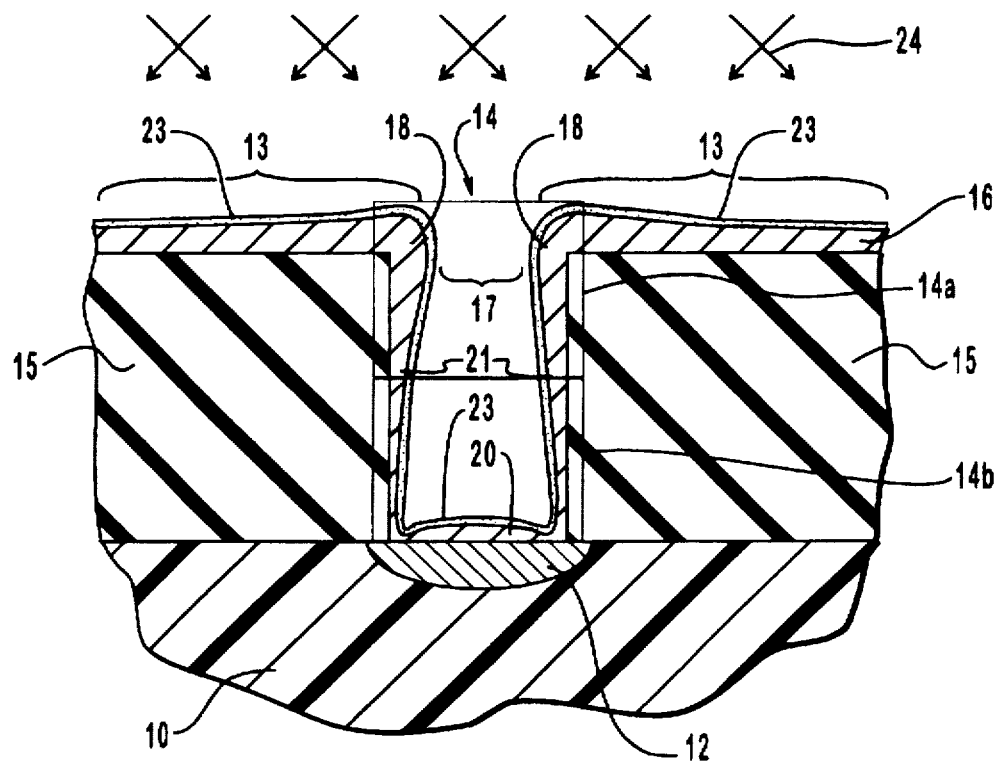
FIG. 3 is a cross-sectional depiction of a contact opening with a material deposited therein that is being selectively etched under the method of the present invention to reduce cusping and widen the contact opening while maintaining the thickness of the material deposited at the bottom of the contact opening.
Figure 4:
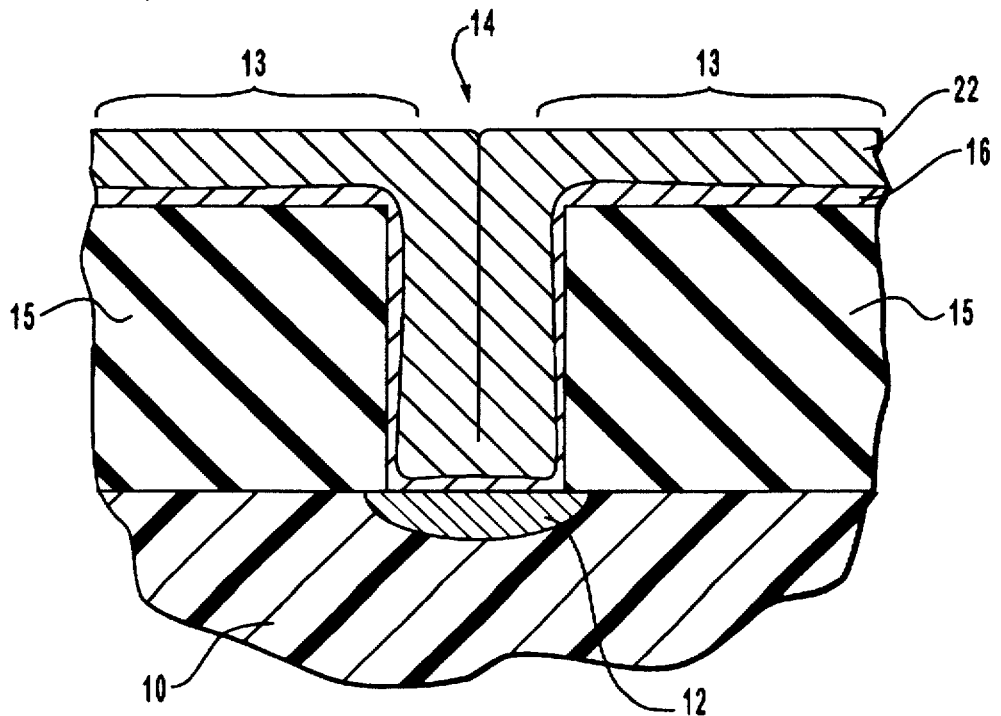
FIG. 4 is a cross-sectional depiction of the contact opening of FIG. 3 showing the result of filling the contact opening after widening the contact opening.

The method of the present invention will be discussed in conjunction with the embodiment of FIGS. 3 and 4, where a contact is being constructed. The first step in the present invention is providing a opening which is to be etched on a structural layer of a semiconductor wafer. Thus, shown in FIG. 3 is a contact opening 14 extending through a passivation layer 15 down to an active region 12 formed over a silicon substrate 10. A diffusion barrier liner layer 16 has been sputtered into contact opening 14 with physical vapor deposition (PVD). Diffusion barrier liner layer 16 has formed cusps 18 at the top or mouth of contact opening 14 during the deposition. A contact opening mouth 17 is located in a contact opening surface 13, and a contact opening sidewall 21 extends from contact opening mouth 17 to contact opening bottom 20. Preferably, contact opening sidewall 21 is substantially orthogonal to silicon substrate 10 and contact opening 14 is a high aspect ratio contact opening.

Contact opening 14 is divided, for discussion purposes, into an upper portion 14a and a lower portion 14b. Upper portion 14a extends down from contact opening surface 13 to a selected depth that is indicated by the line of demarcation between upper portion 14a and lower portion 14b. Lower portion 14b extends from the selected depth to contact opening bottom 20. Thus, contact opening sidewall 21 is also functionally divided into an upper portion extending down from contact opening mouth 17 to the selected depth and a lower portion 14b extending from the selected depth down to contact opening bottom 20.

In a further step of the method of the present invention, an etching agent that is activated by directional energy is adhered to contact opening 14. In the embodiment of FIG. 3, this comprises exposing diffusion barrier liner layer 16 to a halide gas such as a fluorine or chlorine containing compound. Preferably, the etching agent is selected from the group consisting of HCl, CHCl$_3$, Cl$_2$, ClF$_3$, CF$_4$, and CHF$_3$. Diffusion barrier liner layer 16 is exposed in such a way as to adhere the etching agent to diffusion barrier liner layer 16 without substantially reacting with diffusion barrier liner layer 16. The adhered etching agent is shown in FIG. 3 as a light film of etching agent 23. In the depicted embodiment, light film of etching agent 23 has been adhered to diffusion barrier liner layer 16 by exposing diffusion barrier liner layer 16 to CHCL$_3$ gas.

Diffusion barrier liner layer 16 is exposed to the halide gas at a low temperature, typically below about 300° C. The low temperature ensures that insufficient energy is present to activate the etching agent and thereby substantially etch into diffusion barrier liner layer 16. Preferably, diffusion barrier liner layer 16 is exposed to the halide gas at room temperature. The use of a lower energy promotes adsorption or sticking of the etching agent. A low pressure is also used in order to keep the etching agent from coating diffusion barrier liner layer 16 with a thickness that would prevent the penetration of photons through light film of etching agent 23. The low pressure is typically in the range of between about 10 mtorr and about 10 torr of pressure.

In order to activate the etching agent in a manner which selectively etches contact opening 14 with a specified degree of etching occurring down to the selected depth and a lesser degree of etching occurring beyond the selected depth, directional energy is selectively imparted into contact opening 14. In FIG. 3, the directional energy is imparted by photons 24 which are directed to light film of etching agent 23 over diffusion barrier liner layer 16. Lamps or other light sources can be used to selectively direct photons 24 to the surface of diffusion barrier liner layer 16, preferably in a directional manner. Most preferred is that a laser light source is used. For submicron spatial resolution, Ar$^+$ or Kr$^+$ lasers can be used. For large area processing, CO$_2$, Nd:YAG, and Nd:glass type lasers are preferred. A CO$_2$ laser is most preferred, as it offers better power and efficiency.

The directed energy is preferably directed to the surface of diffusion barrier liner layer 16 at an acute angle. As used herein, the term "acute angle" is intended to mean an angle that is not generally parallel to nor normal to contact opening 14. Preferably, the acute angle is selected to allow photons to impact contact opening sidewall 21 down to the selected depth, but not beyond. Thus, in FIG. 3, the acute angle assumed by the path of photons 24 is neither perpendicular nor parallel to contact opening surface 13. Due to the acute angle, contact opening surface 13 blocks the lower portion of diffusion barrier liner layer 16 from substantial exposure to photons 24. FIG. 3 depicts photons 24 shown as arrows which are directed to cusps 18, contact opening surface 13, and contact opening sidewalls 21. Photons 24 are blocked from reaching lower portion 14b and contact opening bottom 20 with a significant flux density.

The energy imparted by photons 24 activates light film of etching agent 23 with an activation preferably proportional to the flux density, such that the portion of diffusion barrier liner layer 16 within upper portion 14a receives a significant flux density of photons 24 and is etched. Consequently, the etch rates will be the highest at contact opening mouth 17 where the flux density of photons 24 is highest. A specified degree of etching, determined by the etchant type, material being etched, and flux density, occurs above the selected depth in upper portion 14a. A lesser degree of etching, preferably none at all, occurs beyond the selected depth in lower portion 14b. Furthermore, contact opening bottom 20, which is blocked from the angular trajectory of photons 24, does not receive a significant flux density of photons 24 and is not substantially etched. This allows contact opening 14 to be widened but not substantially deepened, which is important if a certain aspect ratio of contact opening 14 must be maintained. It is also beneficial in obtaining a more uniform step coverage of diffusion barrier liner layer 16.

Contact opening sidewall 21 is etched to a selected depth which is determined by the selection of an angle of trajectory of photons 24. The selection of a smaller angle of trajectory results in the specified degree of etching of contact opening sidewall 21 occurring down to a greater depth into contact opening 14, while a greater angle results in the specified degree of etching of contact opening sidewall 21 occurring to a shallower depth. Accordingly, the proper selection of the angle of the trajectory of photons 24 is useful in reducing the thickness of an upper portion of contact opening side wall 21 that is thicker than a lower portion of contact opening side wall 21 to thereby control the step coverage of a layer of material such as diffusion barrier liner layer 16.

In a typical application of the method of the present invention, a layer of material is deposited in a contact opening with an aspect ratio of three or higher using physical vapor deposition. When so doing, for instance, a 1000 Angstrom deposition on contact opening surface 13 results in a deposition in contact opening bottom 20 of about 100 Angstroms. Thus, multiple depositions may be required when layers of greater thicknesses are to be deposited. Consequently, diffusion barrier liner layer 16 might be deposited in multiple layers, and each layer etched in the method of the present invention to reduce the thickness at contact opening surface 13 and prevent the formation of keyholes.

After diffusion barrier liner layer 16 is sufficiently formed in the foregoing manner, contact opening 14 is filled with a conductive filler material such as a tungsten layer 22. FIG. 4 shows high aspect ratio contact opening 14 being filled with a uniform step coverage without the formation of keyholes.

Figure 5:
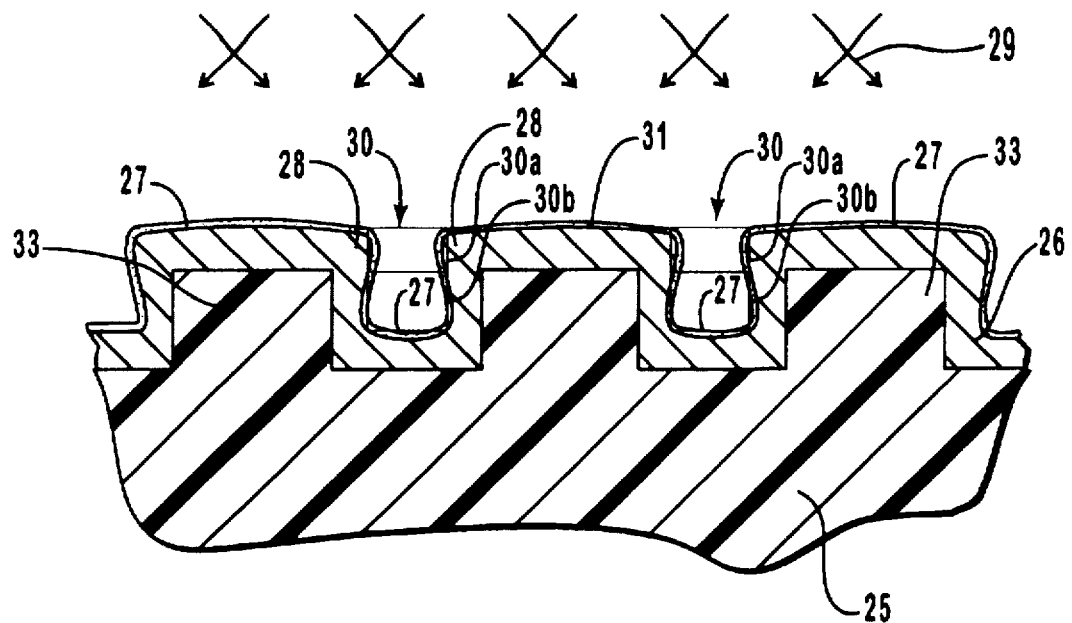
FIG. 5 is a cross-sectional depiction of raised structural features having intervening openings which are to be filled in order to planarize the structural raised features and shows a first step of planarizing using the method of the present invention.

The method of the present invention is also useful for other applications as well. For instance, the method of the present invention can be applied to materials that are insulators as well as those that are conductors. One example of an application for the method of the present invention for use in etching an insulator is shown in FIGS. 5 and 6 and comprises etching deposited insulating planarization layers in order to planarize structural features having a large intervening opening without the formation of keyholes.

When so doing, a first planarization layer 26, typically silicon dioxide or BPSG, is deposited over a silicon substrate 25 which has raised structural features 33 and intervening openings 30 formed thereon. The selective etching process for removing a material from an opening with the use of directional energy of the present invention is then conducted. As discussed, this involves adhering a light film of etching agent 27 over first planarization layer 26 and then directing photons 29 to first planarization layer 26 at an acute angle to a surface 31 of raised structural features 33. The acute angle is, again, selected in order to selectively etch down to a selected depth.

The exposure of light film of etching agent 27 to photons 29 initiates the etching process so as to reduce the thickness of first planarization layer 26 at an upper portion 30a down to the selected depth, and thereby reduce cusps 28 formed in upper portion 30a, without substantially reducing the thickness of first planarization layer 26 below the selected depth at a lower portion 30b.

Figure 6:
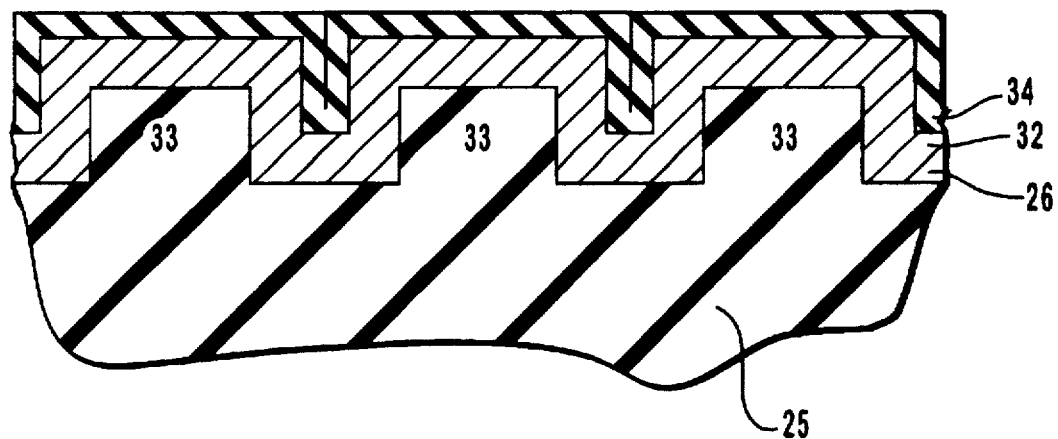
FIG. 6 is a cross-sectional depiction of the opening of FIG. 5 after subsequent steps of planarizing using the method of the present invention.

The result from the foregoing process, as shown in FIG. 6, is a substantially uniform step coverage of first planarization layer 26. After the selective etching step is conducted on first planarization layer 26, a second planarization layer 32 is deposited over first planarization layer 26 and is selectively etched in accordance with the foregoing method steps applied to first planarization layer 26. The process can be continued with additional planarization layers until a planar top surface 34 is formed. The planarization layers may also be further planarized with a height reduction process such as CMP and/or etchback.

Thus, a method is provided by the present invention which can be used to widen openings and which is suitable for use in forming interconnect structures with uniform step coverage and for planarizing raised structural features with intervening openings. The method has also been found to be simple in design, easy to incorporate into current integrated circuit manufacturing process flows, and capable of being easily installed in existing systems with a minimum of modifications.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An etching method comprising:
   providing an opening to a recess within a structural layer, the structural layer having a top surface, the recess extending from the top surface of the structural layer to a depth; and
   forming a material within the recess;
   adhering an etching agent to the opening, wherein the etching agent is selected from the group consisting of HCl, CHCl$_3$, Cl$_2$, ClF$_3$, CF$_4$, and CHF$_3$;
   etching the material from the opening using photons that are directed at a non-orthogonal angle at the top surface, wherein said etching agent is activated by said photons.

2. A method as recited in claim 1, wherein, after etching said material, the recess comprises a mouth, a bottom, and a sidewall, the sidewall having an upper portion extending substantially vertically from the mouth down to a selected depth that is less than the depth of the recess, the sidewall also having a lower portion extending substantially vertically from the selected depth down to the bottom, and wherein said etching removes a greater amount of said material from the upper portion than the lower portion.

3. A method as recited in claim 2, wherein the non-orthogonal angle is an acute angle.

4. A method as recited in claim 3, wherein the acute angle is selected such that the opening is widened down to the selected depth, but is not substantially widened beyond the selected depth.

5. A method as recited in claim 4, wherein, after said etching, the material within the recess that is below said selected depth has a uniform thickness.

6. A method as recited in claim 4, wherein the recess has an aspect ratio of at least three.

7. A method as recited in claim 2, wherein a segment of the etching agent is adhered over the upper portion and is activated by the photons to thereby etch the material from the upper portion, and wherein the top surface of the structural layer at least in part prevents a segment of the etching agent adhered over the lower portion from being exposed to the photons.

8. A method as recited in claim 2, wherein a substantial portion of the photons are blocked by the top surface of the structural layer during etching the material from the opening, such that a first flux density of photons reaches the upper portion and a second flux density of photons reaches the lower portion, the first flux density being greater than the second flux density.

9. A method as recited in claim 2, wherein the mouth has a deposited layer of the material formed thereon, the deposited layer of material defining a protruding cusp and being upon the bottom, and wherein etching the material from the opening causes the etching agent to etch the deposited layer of the material formed on the mouth, thereby reducing the protruding cusp without etching the deposited layer of the material upon the bottom.

10. A method as recited in claim 1, wherein the opening is widened but not substantially deepened by etching a material from the opening.

11. A method as recited in claim 1, wherein the opening forms a part of an interconnect structure.

12. A method as recited in claim 1, wherein adhering an etching agent to the opening is conducted at a temperature below about 300° C.

13. A method as recited in claim 1, wherein adhering an etching agent to the opening is conducted at a pressure within the range of about 10 mtorr to about 10 torr.

14. A method as recited in claim 1, wherein the etching the material within the opening using photons further comprises generating said photon with a laser.

15. An etching method comprising:
   providing a structural layer having a top surface and a recess within the structural layer, the recess extending within the structural layer from the top surface and having a depth within the structural layer;
   forming a material within the recess;
   adhering an etching agent to the material within the recess, wherein the etching agent is selected from the group consisting of HCl, CHCl$_3$, Cl$_2$, ClF$_3$, CF$_4$, and CHF$_3$;
   etching the material within the opening using photons that are directed at a non-orthogonal angle at the top surface, wherein said etching agent is activated by the photons.

16. An etching method comprising:

providing an opening in a structural layer of a semiconductor substrate, the structural layer having a top surface, the opening extending to a total depth and having a mouth, a bottom, and a sidewall, and the sidewall having an upper portion extending substantially vertically from the mouth down to a selected depth that is less than the total depth and also having a lower portion extending substantially vertically from the selected depth down to the bottom;

adhering an etching, agent to the opening, wherein the etching agent is selected from the group consisting of: HCl, CHCl$_3$, Cl$_2$, ClF$_3$, CF$_4$, and CHF$_3$; and etching a material from the opening by directing photons towards the opening at an acute angle to the surface, wherein a greater amount of said material is removed from the uppler portion than from the lower portion.

17. A method as recited in claim 16, wherein the opening is widened but not deepened by etching the material from the opening.

18. A method as recited in claim 17, wherein, after said etching, the opening is widened down to the selected depth but is not widened beyond the selected depth.

19. A method as recited in claim 18, wherein, after said etching, a layer of the material in the opening below said selected depth has a uniform thickness.

20. A method as recited in claim 18, wherein the aspect ratio of the opening is at least three.

21. A method as recited in claim 20, wherein a segment of the etching agent is adhered over the upper portion and is activated by the photons to thereby etch the material from the upper portion, and wherein the top surface prevents another segment of the etching agent that is adhered over the lower portion from being exposed to the photons.

22. A method as recited in claim 21, wherein the opening forms a part of an interconnect structure.

23. A method as recited in claim 16, wherein a portion of the photons are blocked by the top surface during etching the material from the opening, such that a first flux density of photons reaches the upper portion and a second flux density of photons reaches the lower portion, the first flux density being greater than the second flux density.

24. A method as recited in claim 16, wherein the mouth has a deposited layer of the material formed thereon, the deposited layer of material defining a protruding cusp and being upon the bottom, and wherein etching the material from the opening causes the etching agent to etch the deposited layer of the material formed on the mouth, thereby reducing the protruding cusp without etching the deposited layer of the material upon the bottom.

25. A method as recited in claim 16, wherein adhering the etching agent is conducted at a pressure within the range of about 10 mtorr to about 10 torr and at a temperature below about 300° C.

26. A method of widening an interconnect structure opening in a structural layer of a semiconductor substrate, the method comprising:

providing an interconnect structure opening in a surface of a structural layer of a semiconductor substrate, the interconnect structure having a mouth and a bottom, and the mouth having a deposited layer of material formed thereon, the deposited layer of material defining a protruding cusp and being upon the bottom;

adhering an etching agent, selected from the group consisting of HCl, CHCl$_3$, Cl$_2$, ClF$_3$, CF$_4$, and CHF$_3$, to the interconnect structure at a temperature below about 300° C. and at a pressure within the range of about 10 mtorr to about 10 torr; and etching a material from the interconnect structure by directing photons towards the interconnect structure at an acute angle to the surface to widen the interconnect structure down to a selected depth but not beyond the selected depth and thereby achieve an aspect ratio of the interconnect structure opening of at least about 3.

27. A method of planarizing a structural feature situated on a semiconductor substrate, the method comprising:

providing a structural feature on a semiconductor substrate, the structural feature having a first surface and an opening formed in the first surface, the opening extending to a total depth and having a mouth, a bottom, and a sidewall, the sidewall having an upper portion extending substantially vertically from the mouth down to a selected depth that is less than the total depth and also having a lower portion extending substantially vertically from the selected depth down to the bottom;

forming a layer of a material within the opening;

adhering an etching agent selected from the group consisting of: HCl, CHCl$_3$, Cl$_2$, ClF$_3$, CF$_4$, and CHF$_3$ to a material within the opening; and etching said material from within the opening by directing photons towards the opening at an acute angle to the first surface, wherein a greater amount of said material is removed from the upper portion than from the lower portion.

28. A method as recited in claim 27, further comprising forming said layer of material upon the first surface of the structural feature and planarizing the first surface of the structural feature.

29. A method of forming a structural feature situated on a semiconductor substrate, the method comprising:

providing a structural feature on a semiconductor substrate, the structural feature having a first surface and an opening formed in the first surface, the opening extending to a total depth and having a mouth, a bottom, and a sidewall, the sidewall having an upper portion extending substantially vertically from the mouth down to a selected depth that is less than the total depth and also having a lower portion extending substantially vertically from the selected depth down to the bottom;

forming a layer of a material within the opening;

adhering an etching agent to the material within the opening;

etching said material from within the opening by directing photons towards the opening at an acute angle to the first surface, wherein a greater amount of said material is removed from the uppler portion than from the lower portion;

depositing a layer of filler material over the opening, the layer of filler material having an upper level extending above the mouth and a lower level located above the bottom.

30. A method as recited in claim 29, further comprising a step, conducted after the step of depositing a layer of filler material over the opening, of planarizing the upper level of the layer of filler material.

31. A method of planarizing a structural feature situated on a semiconductor substrate, the method comprising:

providing a structural feature on a semiconductor substrate, the structural feature having a first surface and an opening formed in the first surface, the opening extending to a total depth and having a mouth, a bottom, and a sidewall, the sidewall having an uppler portion extending substantially vertically from the mouth down to a selected depth that is less than the total depth and also having a lower portion extending substantially vertically from the selected depth down to the bottom, forming a layer of a material within the opening;

adhering an etching agent to the material within the opening etching said material from within the opening by directing photons towards the opening at an acute angle to the first surface, wherein a greater amount of said material is removed from the uppler portion than from the lower portion;

depositing a layer of filler material over the opening, the layer of filler material having an upper level extending above the opening and a lower level located above the bottom and below the mouth;

adhering a film of etching agent to the layer of filler material;

directing photons towards the etching agent on the filler material at an acute angle to the first surface, such that the filler material over the upper level of the first surface is etched at a greater rate than the filler material over the lower level of the first surface; and forming a planarized top surface over the opening by repeating the steps of:

depositing a layer of filler material over the opening;
adhering a film of etching agent to the layer of filler material; and
directing photons towards the etching agent on the filler material.

32. A method as recited in claim 31, further comprising performing a height reduction process upon the planarized top surface, the height reduction process being at least one of a chemical-mechanical process and an etchback.

33. A method as recited in claim 31, wherein the layer of filler material is a dielectric.

34. A method as recited in claim 33, wherein the opening is composed of a dielectric.

35. A method of reducing cusping at an entrance to a recess, the method comprising:

forming a recess in a layer having a top surface, the recess having an entrance at the top surface and a width;

decreasing some but not all of the width of the entrance by forming a first material within the opening;

forming an etching agent selected from the group consisting of: HCl, CHCl$_3$, Cl$_2$, ClF$_3$, CF$_4$, and CHF$_3$, upon the first material within the opening;

increasing the width of the entrance to the recess by directing light at the etching agent at an acute angle to the top surface of the layer.

36. The method as defined in claim 35, wherein:

the recess has a sidewall extending from the entrance into the layer past a selected depth, forming the first material within the opening further comprises forming the first material upon the sidewall on opposite sides of the selected depth; and directing light at the etching agent removes more of the first material on the sidewall that is above the selected depth than is below the selected depth.

37. A method of reducing cusping at an entrance to a recess, the method comprising:

forming a recess in a layer having a top surface, the recess having an entrance at the top surface, a width, and a sidewall extending from the entrance into the layer past a selected depth;

decreasing some but not all of the width of the entrance by forming a first material within the opening upon the sidewall on opposite sides of the selected depth;

forming an etching agent upon the first material within the opening;

increasing the width of the entrance to the recess by directing light at the etching agent at an acute angle to the top surface of the layer so as to remove more of the first material on the sidewall that is above the selected depth than is below the selected depth;

filling the recess with a layer of filler material formed upon the first material, the layer of filler material having an upper level extending above the entrance to the recess and a lower level located above a bottom of the recess and below the entrance to the recess;

adhering a film of etching agent to the layer of filler material;

directing light towards the etching agent on the filler material at an acute angle to the top surface of the layer such that the filler material over the upper level of the top surface of the layer is etched at a greater rate than the filler material over the lower level of the top surface of the layer.

38. A method of reducing cusping at an entrance to a recess in a layer having a top surface, the recess having an entrance at the top surface, the entrance having a width at the top surface, the method comprising:

decreasing the width of the entrance to the recess by forming a first material on the entrance to the opening;

forming an etching agent selected from the group consisting of: HCl, CHCl$_3$, Cl$_2$, ClF$_3$, CF$_4$, and CHF$_3$ upon the first material within the opening;

increasing the width of the entrance to the recess by activating the etching agent by directing photons at the activating agent at an acute angle to the top surface of the layer.

39. A method of reducing cusiping at an entrance to a recess in a layer having a top surface, the recess having an entrance at the top surface, the entrance having a width at the top surface, the method comprising:

decreasing the width of the entrance to the recess by forming a first material on the entrance to the opening:

forming an etching agent upon the first material within the opening;

increasing the width of the entrance to the recess by activating the etching agent by directing photons at the activating agent at an acute angle to the top surface of the layer;

filling the recess with a layer of filler material formed upon the first material, the layer of filler material having an upper level extending above the entrance to the recess and a lower level located above a bottom of the recess and below the entrance to the recess;

adhering a film of etching agent to the layer of filler material;

directing light towards the etching agent on the filler material at an acute angle to the top surface of the layer such that the filler material over the upper level of the top surface of the layer is etched at a greater rate than the filler material over the lower level of the top surface of the layer.

40. A method of reducing cusping at an entrance to a recess in a layer having a top surface, the recess having a sidewall extending from the entrance into the layer past a selected depth and having an entrance at the top surface, the entrance having, a width at the top surface, the method comprising:

decreasing the width of the entrance to the recess by forming a first material on the entrance to the opening;

forming an etching agent upon the first material within the opening, and upon the sidewall on opposite sides of the selected depth; and increasing the width of the entrance to the recess by activating the etching agent by directing photons at the activating agent at an acute angle to the top surface of the layer so as to remove more of the first material on the sidewall that is between the selected depth and the top surface than is below the selected depth.

41. A material removal method comprising:

providing an opening in a structural layer, the opening extending from a top surface of the structural layer to a total depth; and removing a material having an etching agent adhered thereto, the etching agent is selected from the group consisting of HCl, $CHCl_3$, $Cl_2$, $ClF_3$, $CF_4$, and $CHF_3$, the material being removed from the opening using directional energy that is directed at a non-orthogonal angle at the top surface, wherein a different amount of said material in the opening is removed above a selected depth than is removed below the selected depth, and wherein the selected depth is less than the total depth.

* * * * *

UNITED STATES PATENT AND TRADEMARK OFFICE
CERTIFICATE OF CORRECTION

PATENT NO. : 5,893,758
DATED : Apr. 13, 1999
INVENTOR(S) : Gurtej S. Sandhu; Anand Srinivasan It is certified that error appears in the above-identified patent and that said Letters Patent is hereby corrected as shown below:

Col 2, line 25, after "at" delete "a"

Col. 2, line 35, after "tungsten" delete "18"

Col. 4, line 62, after "providing" change "a" to --an--

Col. 8, line 51, after "wherein" delete "the"

Col. 10, line 54, after "the" change "uppler" to --upper--

Col. 11, line 3, after "an" change "uppler" to --upper--

Col. 11, line 15, after "the" change "uppler" to --upper--

Col. 12, line 42, after "reducing" change "cusiping" to --cusping--

Signed and Sealed this

Second Day of May, 2000

Attest:

Q. TODD DICKINSON

*Attesting Officer*    *Director of Patents and Trademarks*